US 6,538,375 B1

(12) United States Patent
Duggal et al.

(10) Patent No.: US 6,538,375 B1
(45) Date of Patent: Mar. 25, 2003

(54) OLED FIBER LIGHT SOURCE

(75) Inventors: Anil Raj Duggal, Niskayuna, NY (US);
Lionel Monty Levinson, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/640,950

(22) Filed: Aug. 17, 2000

(51) Int. Cl.[7] .......................... H05B 33/20; H05B 33/26
(52) U.S. Cl. ...................... 313/506; 313/504; 313/505; 313/509; 313/511
(58) Field of Search ................. 313/506, 504, 313/507, 511

(56) References Cited

U.S. PATENT DOCUMENTS

| | | | | |
|---|---|---|---|---|
| 3,792,308 A | * | 2/1974 | Ota | 313/506 |
| 5,485,355 A | | 1/1996 | Voskoboinik et al. | 362/84 |
| 5,546,413 A | * | 8/1996 | Lebby et al. | 257/40 |
| 5,710,484 A | * | 1/1998 | Iwanaga et al. | 313/504 |
| 5,753,381 A | * | 5/1998 | Feldman et al. | 428/690 |
| 5,855,994 A | * | 1/1999 | Biebuyck et al. | 428/209 |
| 5,869,930 A | | 2/1999 | Baumberg et al. | 313/506 |
| 5,876,863 A | | 3/1999 | Feldman et al. | 428/690 |
| 5,959,402 A | * | 9/1999 | Polyan | 313/511 |
| 6,008,578 A | * | 12/1999 | Chen | 313/506 |
| 6,074,071 A | | 6/2000 | Baumberg et al. | 362/101 |
| 6,118,212 A | * | 9/2000 | Nakaya et al. | 313/503 |
| 6,191,433 B1 | * | 2/2001 | Roitman et al. | 257/40 |
| 6,198,220 B1 | * | 3/2001 | Jones et al. | 313/512 |
| 6,228,228 B1 | * | 5/2001 | Singh et al. | 204/192.1 |
| 6,229,259 B1 | * | 5/2001 | Christensen, Sr. | 257/40 |

FOREIGN PATENT DOCUMENTS

JP            110403-45       *  2/1999

OTHER PUBLICATIONS

Ono, "Electroluminescent Displays", World Scientific Publishing Co., 1995, pp. 6–17.
Muller, "Solid State Luminescence: Theory, Materials, and Devices", article entitled "Thin Film Electroluminescence", Chapman & Hall, 1993, pp. 133–157.
Duggal et al., "Organic Light Emitting Device and Method for Mounting" filed Jun. 12, 2000, S.N. 09/592,078.
Duggal et al., "Luminescent Display and Method of Making", filed Dec. 22, 1999, S.N. 09/469,702.

* cited by examiner

*Primary Examiner*—Nimeshkumar D. Patel
*Assistant Examiner*—Sikha Roy
(74) *Attorney, Agent, or Firm*—Toan O. Vo; Noreen C. Johnson

(57) ABSTRACT

A flexible organic light emitting diode (OLED) fiber light source is provided. The OLED contains a fiber core, a cathode, at least one organic radiation emitting layer and a transparent anode. The fiber light source may be used as a flexible novelty lighting article or coiled inside a large area lighting source.

24 Claims, 9 Drawing Sheets

OLED FIBER LIGHT SOURCE

BACKGROUND OF THE INVENTION

The present invention relates generally to lighting devices, and more particularly to an organic light emitting diode.

Electroluminescent (EL) devices have been known for more than 60 years. A schematic illustration of an electroluminescent device 1 is shown in FIG. 1. The EL device 1 contains an inorganic phosphor layer 3, such as ZnS, doped with activator ions, such as Mn. The phosphor layer 3 is sandwiched between two insulating layers 5 and 6. A cathode 7 and an anode 8 are located on the outer sides of the respective insulating layers 5, 6.

EL emission occurs in the following way. Above a threshold voltage applied between the anode 8 and the cathode 7, electrons are injected from the interface states between the phosphor layer 3 and the insulating layers 5, 6 by high field assisted tunneling. The injected electrons (illustrated by arrows) excite the activators in the phosphor layer 3 through an impact excitation mechanism. The excited activators then make radiative transitions to the ground state and emit light. The electrons travel in the conduction band from the interface between the phosphor layer 3 and the insulating layer 5 to the interface between layers 3 and 6, where they are trapped and cause polarization. When the polarity of the ac voltage wave is reversed, the same process takes place in the opposite direction in the phosphor layer. Thus, light emission takes place from the activator ions in the inorganic phosphor, due to the collisions with electrons travelling in the electronic bands of the phosphor under an applied electric field.

Flexible fiber electroluminescent light sources are known in the art, as set forth, for example in U.S. Pat. Nos. 6,074,071, 5,485,355 and 5,876,863. However, these EL devices are unable to achieve sufficient brightness for many lighting applications.

Chemiluminescent fiber light sources are also known. These devices emit light when they are twisted to combine two chemicals contained in the fiber. The chemical reaction between the chemicals produces light while the chemical reaction proceeds for a few hours. However, these prior art chemiluminescent fiber light sources also lack sufficient brightness, and have a very short lifetimes, on the order of a few hours.

In contrast, organic light emitting devices (OLEDs) have only been known for about 10 years. These devices operate in a fundamentally different way from EL devices. FIG. 2 is a schematic illustration of an OLED 11. The OLED device 11 includes an organic radiation emitting layer 13 disposed between two electrodes, e.g., a cathode 17 and a light transmissive anode 18, formed on a flat sheet, light transmissive substrate 19. The organic radiation emitting layer 13 emits light upon application of a voltage across the anode and cathode. For example, the organic emitting layer 13 may comprise a polymer layer in direct contact with the cathode 17 and the anode 18. No insulating layers which prevent charge transfer from the electrodes to the organic layer are present between layers 13, 17 and 18. Upon the application of a voltage from a voltage source 14, electrons are directly injected into the organic layer 13 from the cathode 17, and holes are directly injected into the organic layer 13 from the anode 18. The electrons and the holes travel through the layer 13 until they recombine to form excited molecules or excitons. The excited molecules or excitons emit radiation (i.e., visible light or UV radiation) when they decay. Thus, the OLED 11 emits radiation (illustrated by the arrows in FIG. 2) by electron-hole recombination due to direct electron and hole injection into the radiation emitting layer, rather than by activator ion excitation by electrons, as in an EL device.

The OLED devices are much brighter than EL or chemiluminescent devices. However, the flat plate shaped OLED devices formed on flat sheet substrates are generally not flexible, as the EL or chemiluminescent devices. There have been attempts to attain a high degree of mechanical flexibility in an OLED. For example, U.S. Pat. No. 5,844,363 and an article in Volume 357, page 477 of the Jun. 11, 1992 issue of *Nature* describe an OLED device 11 formed on a flexible, light transmissive flat plastic PET sheet which is used as the substrate 19. However, the resulting OLED 11 has an impracticably short life due to water and/or oxygen permeation into the light emitting layer 13. Attempts have been made to add barrier layers, such as $SiO_2$ and $Si_3N_4$, to the plastic film 19 to eliminate the water and/or oxygen permeation. However, the barrier layers have not led to long lived devices. Another approach is to fabricate the OLED 11 on a very thin glass sheet substrate 19 to impart moderate flexibility to the device. However, the thin glass sheet substrates are only moderately flexible and are not amenable to low cost, continuous processing. The present invention is directed to overcoming or at least reducing the problems set forth above.

BRIEF SUMMARY OF THE INVENTION

In accordance with one aspect of the present invention, there is provided a fiber organic radiation emitting device comprising a fiber core having an outer first electrode, at least one organic radiation emitting layer positioned over an outer surface of the first electrode, and a radiation transmissive second electrode positioned over the organic radiation emitting layer.

In accordance with another aspect of the present invention, there is provided a flexible, fiber organic radiation emitting device, comprising a flexible elongated core member having an outer surface, a cathode having an inner surface surrounding the outer surface of the core member, at least one non-planar organic radiation emitting layer, having an inner surface surrounding and contacting an outer surface of the cathode, a radiation transmissive anode having an inner surface surrounding and contacting an outer surface of the at least one organic radiation emitting layer, a metal contact element having a first surface in contact with a first portion of an outer surface of the anode, and a power source electrically connected to the cathode and the metal contact element.

In accordance with another aspect of the present invention, there is provided a method of making a flexible organic radiation emitting device, comprising forming a core having an outer first electrode layer, depositing at least one organic radiation emitting layer around the first electrode layer, depositing a second electrode layer around the at least one organic radiation emitting layer, and electrically connecting a power source to the first and second electrode layers.

In accordance with another aspect of the present invention, there is provided a continuous method of making a flexible fiber organic radiation emitting device, comprising winding a flexible fiber core member having an outer first electrode layer from a first spool to a second spool, depositing at least one organic radiation emitting layer around the first electrode layer in a first deposition area, depositing a second electrode layer around the at least one organic radiation emitting layer in a second deposition area, unwinding the coated core from the second spool and separating the coated core into a plurality of flexible fiber sections, and electrically connecting a power source to the first and second electrodes on at least a first fiber section.

In accordance with another aspect of the present invention, there is provided an apparatus for continuous fabrication of a flexible fiber organic radiation emitting device, comprising first means for winding a flexible fiber core member containing an outer cathode layer to a second means, third means for depositing at least one organic radiation emitting layer around the cathode layer in a first deposition area, and fourth means for depositing a radiation transmissive anode layer around the at least one organic radiation emitting layer in a second deposition area.

In accordance with another aspect of the present invention, there is provided an apparatus for continuous fabrication of a flexible fiber organic radiation emitting device, comprising a first spool, a second spool, an organic layer deposition chamber, in which at least one organic radiation emitting layer is deposited around a first electrode layer, and a first electrode deposition chamber capable of coating plural sides of a fiber, in which a first electrode layer is deposited around the at least one organic radiation emitting layer.

BRIEF DESCRIPTION OF THE DRAWINGS

Other features and advantages of the invention will be apparent from the following detailed description of preferred embodiments and the accompanying drawings, in which.

DETAILED DESCRIPTION OF THE INVENTION

Figure 1:
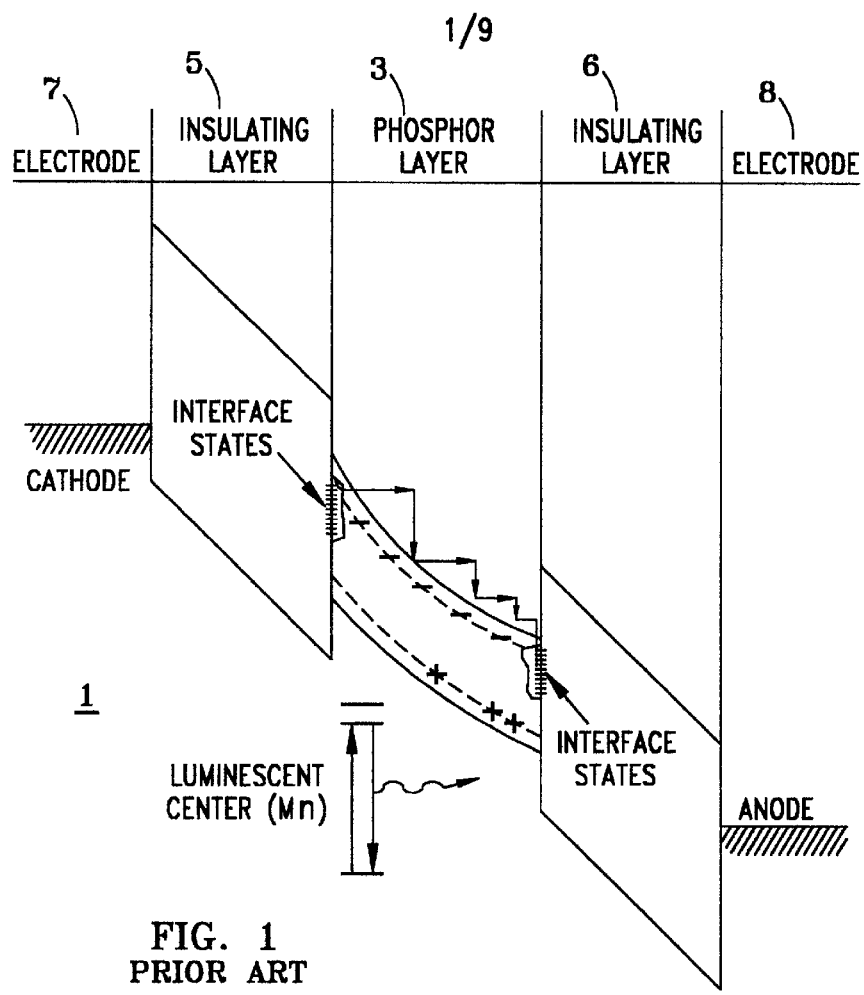
FIG. 1 is a schematic illustration of a prior art EL device.
Figure 2:
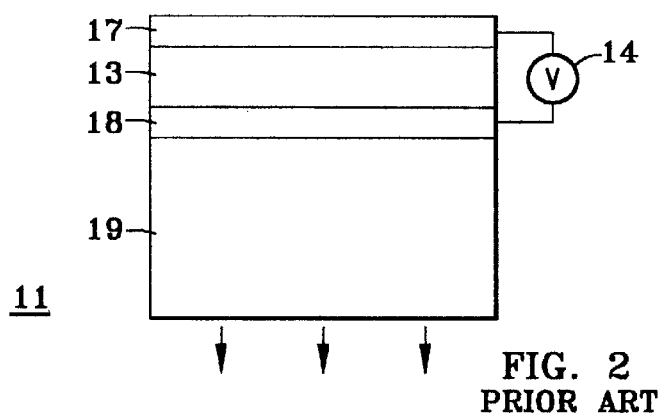
FIG. 2 is a side cross sectional view of a prior art OLED device.

The present inventors have discovered that a high brightness OLED lighting device can be made flexible if it has a fiber or tube shape. Such OLED devices are much brighter than EL or chemiluminescent devices. The OLED lighting device also has a much longer intrinsic lifetime than chemiluminescent devices. Furthermore, the fiber or tube shaped OLED devices may have an improved moisture resistance while remaining flexible, in contrast to prior art flat plate OLED device 11 of FIG. 2, by adding an outer moisture/air barrier layer and/or by forming an outer moisture and air impervious metal electrode around the fiber core. The term "fiber" means a flexible shape having a length which is much greater than the cross sectional diameter (or width or height for non-circular cross sections). In a preferred embodiment of the present invention, the term "fiber" means a flexible shape that can be bent in a curve that has a rather small radius of curvature, such as 10 cm or less, and a rather large length to diameter ratio, such as 10:1 or greater. Most preferably, the radius of curvature is smaller than 1 cm and the length to diameter ratio is 100:1 or greater.

Figure 3:
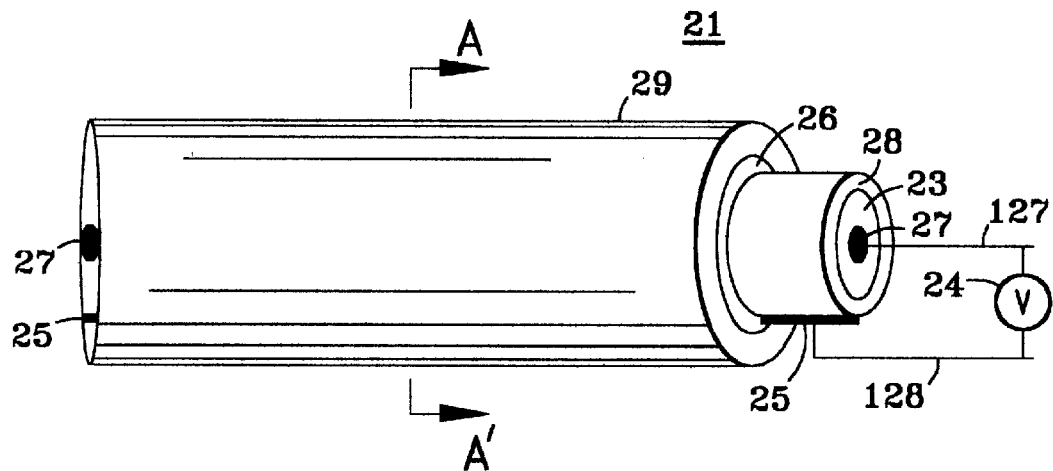
FIG. 3 is a side view of a fiber OLED light emitting device according to a preferred embodiment of the present invention.
Figure 4:
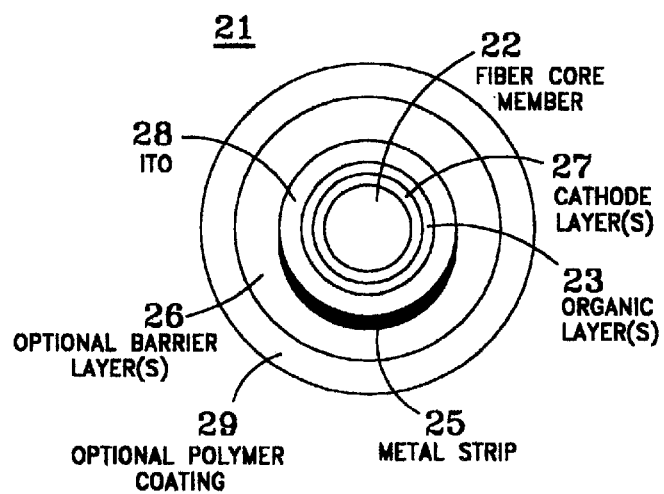
FIG. 4 is a front cross sectional view of an OLED light emitting device, along line A–A' in FIG. 3.

FIG. 3 illustrates a side view of a flexible fiber organic radiation emitting device 21, such as an OLED light emitting device, according to a preferred embodiment of the present invention. FIG. 4 is a front cross sectional view along plane A–A' in FIG. 3. The term "radiation" includes ultraviolet ("UV") and infrared ("IR") radiation as well as visible light. The fiber organic radiation emitting device 21 contains a fiber core having an outer first electrode 27, at least one organic radiation emitting layer 23 positioned over the outer surface of the first electrode 27, and a radiation transmissive second electrode 28 positioned over the at least one organic radiation emitting layer 23. The first electrode 27 may be a cathode and the second electrode 28 may be a light transmissive anode. However, the polarity of the electrodes 27, 28 may be reversed, and electrode 27 may be the anode and electrode 28 may be the cathode. Preferably, an inner surface of electrode 28 surrounds and contacts an outer surface of the at least one organic radiation emitting layer 23, and an inner surface of the at least one organic radiation emitting layer 23 surrounds and contacts the outer surface of the electrode 27. The two electrodes 27, 28 and the organic radiation emitting layer 23 comprise the OLED device.

In one preferred aspect of the present invention, the fiber core may comprise a flexible fiber core member 22 and the first electrode 27 over the outer surface of the fiber core member 22. Preferably, the fiber core member 22 has the non-planar outer surface, such as a circular outer surface, and the first electrode 27 is formed around the entire outer surface of the fiber core member 22, such that the electrode 27 also has a non-planar outer surface, such as a circular surface. In an alternative preferred aspect of the present invention, the fiber core member 22 may be omitted, and the fiber core may consist entirely of the first electrode 27, such as a metal electrode having an elongated fiber shape. The electrode 27 may be hollow or solid. Preferably, the electrode contains a non-planar outer surface, such as a circular surface.

The flexible OLED device 21 further comprises a power source 24 electrically connected to the cathode 27 and the anode 28. The power source 24 may be a voltage source, such as a small battery, or a plug that plugs into a socket. The power source 24 is connected to the cathode 27 and the anode 28 by leads 127, 128, as illustrated in FIG. 3. The power source may also contain a switch which allows the user to turn the device 21 on and off, and/or a brightness control, such as a potentiometer.

Figure 5:
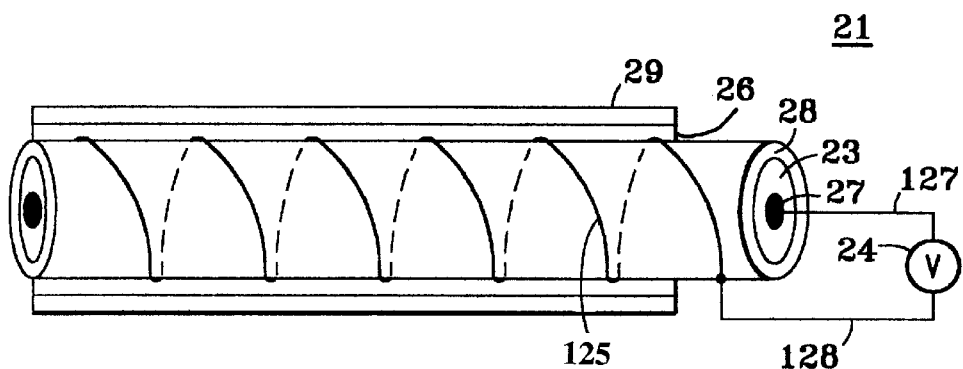
FIG. 5 is a side cut-away view of an OLED light emitting device according to a one aspect of the preferred embodiment of the present invention.

In a preferred aspect of the present invention, the fiber device 21 also contains a metal contact element 25 in contact with a first portion of the outer surface of the radiation transmissive anode 28. The purpose of the contact element 25 is to reduce the voltage drop along the length of the fiber device 21, since a radiation transmissive anode material, such as indium tin oxide (ITO), may not have a high enough electrical conductivity to obtain the desired value of the voltage drop. The contact element 25 may be a metal strip in contact with one portion of the outer surface anode 28, as illustrated in FIG. 3, or a metal wire 125 wrapped around (i.e., surrounding an entire perimeter of) the outer surface of the anode 28, as illustrated in FIG. 5. The metal wire is sufficiently thin to expose a sufficient amount of the anode surface to allow the radiation to be emitted through the transmissive anode.

If desired, the OLED device 21 may also contain an optional radiation transmissive moisture and/or air barrier layer 26 and/or an optional radiation transmissive encapsulating material 29, as illustrated in FIGS. 3–5 (layers 26 and 29 are shown in cut away view in FIG. 5). The inner surface of layer 26 surrounds the outer surface of the anode 28, and the inner surface of material 29 surrounds the outer surface of the layer 26, if layer 26 is present, or the outer surface of the anode 28.

Figure 6:
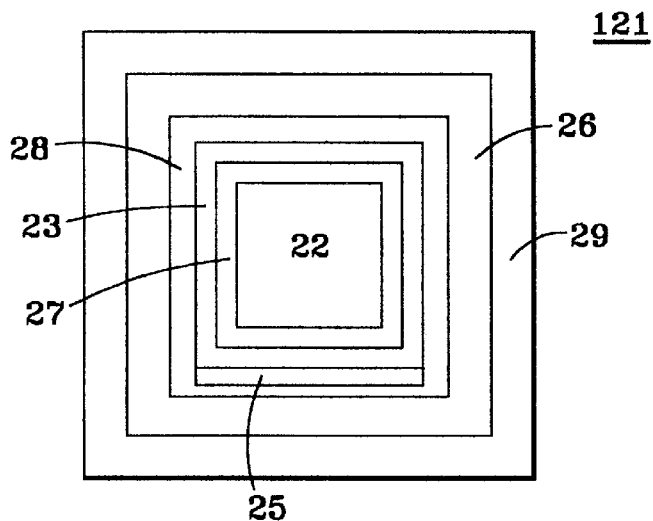
FIGS. 6 and 7 are front cross sectional views of an OLED light emitting devices, along line A–A' in FIG. 3, according to alternative embodiments of the present invention.
Figure 7:
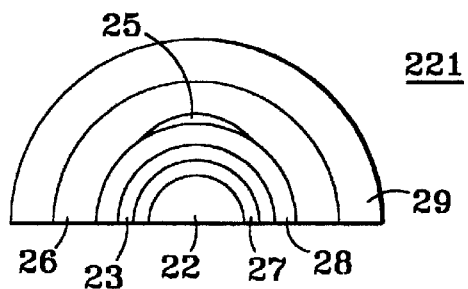

While the fiber organic light emitting device 21 is illustrated in FIG. 4 as having a circular cross section, the device 21 may have any other desired cross section. For example, the fiber may contain an oval cross section, a polygonal cross section or a combination circular, oval or polygonal cross sections. FIG. 6 illustrates a fiber organic light emitting device 121 having a square cross section, which is an example of a polygonal cross section. In the embodiments of FIGS. 4 and 6, layer 23 completely surrounds layer 27, and layer 28 completely surrounds layer 23. FIG. 7 illustrates a fiber organic light emitting device 221 having a combination cross section. In the embodiment of FIG. 7, layer 23 partially surrounds layer 27, and layer 28 partially surrounds layer 23 (i.e., the upper layers surround at least one curved outer surface of the lower layers). As illustrated in FIGS. 3–7, the device 21, 121, 221 has an elongated fiber shape and does not contain a sheet shaped, planar light transmissive device substrate. The organic layer 23 preferably fully or partially surrounds the fiber core 22/27, rather than being formed on one flat side thereof. The device 21, 121, 221 preferably has a diameter (or height/width for non-circular cross sections) of about 1 micron to about 2 mm, most preferably, 10 microns to 0.1 mm.

Elements 22, 23, 25, 26, 27, 28 and 29 of the OLED device 21, 121, 221 may comprise any suitable materials. For example, these elements may comprise the following materials. The flexible core member 22, if present, may comprise a flexible metal wire, such as an aluminum, copper or steel wire, a flexible glass fiber or a flexible plastic fiber. The core member preferably has a diameter (or height or width for non-circular cross sections) of about 1 micron to about 10 mm, most preferably, 10 microns to 0.1 mm.

The anode 28 and cathode 27 inject charge carriers, i.e. holes and electrons, into the organic radiation emitting layer 23, where the carriers recombine to form excited molecules or excitons which emit light when the molecules or excitons decay. The wavelength of radiation (i.e., the color of visible light or the wavelength of ultraviolet or infrared radiation) emitted by the molecules or excitons depends on the energy difference between the excited state and the ground state of the molecules or excitons. Typically, the applied voltage is about 3–10 volts, but can be up to 30 volts or more, and the external quantum efficiency (photons out/electrons in) is between 0.01% and 5%, but could be up to 10%, 20%, 30%, or more. The organic radiation emitting layer 23 preferably has a thickness of about 50 to about 500 nanometers, and the electrodes 27, 28 each preferably have a thickness of about 100 to about 10,000 nanometers.

The cathode 27 generally comprises a material having a low work function value such that a relatively small voltage causes emission of electrons from the cathode. The cathode 27 may comprise, for example, calcium or a metal such as gold, indium, manganese, tin, lead, aluminum, silver, magnesium, or a magnesium/silver alloy. Alternatively, the cathode 27 can be made of two sublayers to enhance electron injection. Examples include a thinner sublayer of LiF (adjacent to layer 23) and a thicker sublayer layer of aluminum or silver (adjacent to the core member 22), or a thinner sublayer layer of calcium (adjacent to layer 23) and a thicker sublayer layer of aluminum or silver (adjacent to the core member 22). The LiF sublayer may be 1 or 2 monolayers (i.e., atomic layers) thick.

The anode 28 typically comprises a material having a high work function value. The anode 28 is preferably transparent, so that light or radiation (i.e., UV or IR radiation) generated in the organic radiation emitting layer 23 can propagate out of the organic radiation emitting device 21. The anode 28 may comprise, for example, indium tin oxide (ITO), tin oxide, nickel, or gold. The electrodes 27, 28 can be formed by conventional vapor deposition techniques, such as evaporation, sputtering or chemical vapor deposition, or by liquid deposition methods, such as electroless plating, electroplating and sol-gel deposition for metal oxide layers, such as ITO.

The contact element 25, 125 may comprise any conductive metal, such as aluminum or copper. The moisture barrier layer 26 may comprise any material that prevents moisture from permeating into the organic layer 23, such as $SiO_2$, $Si_3N_4$ or silicon oxynitride. The encapsulation material 26 may comprise silicone or epoxy. If desired, a luminescent material, such as a phosphor or a fluorescent dye may be added to the encapsulation material 26. The luminescent material emits visible light having a first wavelength, in response to being irradiated by visible or ultraviolet radiation having a shorter, second wavelength, emitted by the organic radiation emitting layer 23. For example, the luminescent material may emit yellow or white light in response to incident ultraviolet or blue radiation, respectively, from layer 23. The mixture of blue and yellow light appears as white light to an observer. Thus, the device 21 appears to emit white light to the observer, even when layer 23 does not emit white light. The device may also emit any color of light other than white, if desired.

Examples of phosphor materials that can be utilized include those phosphors based on cerium doped into a $Y_3Al_5O_{12}$ (YAG) lattice which crystallizes in the garnet structure. Specific examples include $(Y_{1-x-y}Gd_xCe_y)_3$ $Al_5O_{12}$ (YAG:Gd,Ce), $(Y_{1-x}Ce_x)_3Al_5O_{12}$ (YAG:Ce), $(Y_{1-x}Ce_x)_3(Al_{1-y}Ga_y)_5O_{12}$ (YAG:Ga,Ce) and $(Y_{1-x-y}Gd_xCe_y)_3$ $(Al_{5-z}Ga_z)_5O_{12}$ (YAG:Gd,Ga,Ce) and $(Gd_{1-x}Ce_x)Sc_2Al_3O_{12}$ (GSAG). The YAG phosphors can be described generally as $(Y_{1-X-Y}Gd_XCe_Y)_3(Al_{1-Z}Ga_Z)_5O_{12}$, wherein $x+y \leq 1$;

$0 \leq x \leq 1$; $0 \leq y \leq 1$; and $0 \leq z \leq 1$. The position of the peak of the emission band varies considerably in the aforementioned phosphors. Depending on the garnet composition, the $Ce^{3+}$ emission can be tuned from the green (approximately 540 nm; YAG:Ga,Ce) to the red (approximately 600 nm; YAG:Gd:Ce) without appreciable loss in the luminescence efficiency. An appropriate phosphor material or blend of phosphor materials in combination with a blue or UV emission of the organic radiation emitting device 21 can produce a white field corresponding to a wide range of color temperatures. Light sources in the form of large area white light electroluminescent panels which closely approximate the color, CRI, and brightness of conventional fluorescent lamps can be made with such phosphors and organic radiation emitting devices.

In addition, more than one phosphor material may be combined together and then utilized with an organic radiation emitting device to achieve different colors, color temperatures, and color rendition indices. Other phosphors which can be used are described in U.S. patent application Ser. No. 09/469,702, entitled "Luminescent Display and Method of Making", filed Dec. 22, 1999, in the name of Anil Duggal and Alok Srivastava, which is hereby incorporated by reference. An example of a suitable red emitting inorganic phosphor is $SrB_4O_7:Sm^{2+}$, where the $Sm^{2+}$ following the colon represents an activator. This phosphor absorbs most visible wavelengths shorter than 600 nm and emits light as a deep red line with a wavelength greater than 650 nm. An example of a suitable green emitting inorganic phosphor is $SrGa_2S_4:Eu^{2+}$. This phosphor absorbs below 500 nm and has a maximum emission at 535 nanometers. An example of a suitable blue emitting inorganic phosphor is $BaMg_2Al_{16}O_{27}:Eu^{2+}$. $BaMg_2Al_{16}O_{27}:Eu^{2+}$ absorbs most wavelengths below 430 nm and has a maximum emission at 450 nm. Examples of organic dyes which can be utilized as the luminescent material include coumarin 460 (blue), coumarin 6 (green), and nile red.

The organic radiation emitting device 21 may also include an optional radiation scattering layer, comprising scattering particles such as $TiO_2$, $Al_2O_3$, or $SiO_2$ for effective color mixing and brightness uniformity. The scattering particles can also be mixed into the encapsulating material 29, or be formed as a separate layer over the encapsulating material 29, if desired.

A variety of organic radiation emitting layers 23 can be used in conjunction with exemplary embodiments of the invention. The organic radiation emitting layer may comprise at least one polymer layer or at least one organic molecule containing layer.

According to one preferred embodiment, the organic radiation emitting layer 23 comprises a single layer. The organic radiation emitting layer 23 may comprise, for example, a conjugated polymer which is luminescent, a hole-transporting polymer doped with electron transport molecules and a luminescent material, or an inert polymer doped with hole transporting molecules and a luminescent material. The organic radiation emitting layer 23 may also comprise an amorphous film of luminescent small organic molecules which can be doped with other luminescent molecules.

According to other preferred embodiments of the present invention, the organic radiation emitting layer 23 comprises two or more sublayers which carry out the functions of hole injection, hole transport, electron injection, electron transport, and luminescence. Only the luminescent layer is required for a functioning device. However, the additional sublayers generally increase the efficiency with which holes and electrons recombine to produce light. Thus the organic radiation emitting layer 23 can comprise 1–4 sublayers including, for example, a hole injection sublayer, a hole transport sublayer, a luminescent sublayer, and an electron injection sublayer. Also, one or more sublayers may comprise a material which achieves two or more functions such as hole injection, hole transport, electron injection, electron transport, and luminescence.

The preferred embodiments in which the organic radiation emitting layer 23 comprises a single layer, as shown in FIG. 4, will now be described. According to one embodiment, the organic radiation emitting layer 23 comprises a conjugated polymer. The term conjugated polymer refers to a polymer which includes a delocalized π-electron system along the backbone of the polymer. The delocalized π-electron system provides semiconducting properties to the polymer and gives it the ability to support positive and negative charge carriers with high mobilities along the polymer chain. The polymer film has a sufficiently low concentration of extrinsic charge carriers that on applying an electric field between the electrodes, charge carriers are injected into the polymer and radiation is emitted from the polymer. Conjugated polymers are discussed, for example, in R. H. Friend, 4 Journal of Molecular Electronics 37–46 (1988).

One example of a conjugated polymer which emits light upon application of a voltage is PPV (poly(p-phenylenevinylene)). PPV emits light in the spectral range of about 500–690 nanometers and has good resistance to thermal and stress induced cracking. A suitable PPV film typically has a thickness of about 100–1000 nanometers. The PPV film can be formed by spin coating a solution of the precursor to PPV in methanol onto a substrate and heating in a vacuum oven.

Various modifications can be made to the PPV while retaining its luminescent properties. For example, the phenylene ring of the PPV can optionally carry one or more substituents each independently selected from alkyl, alkoxy, halogen, or nitro. Other conjugated polymers derived from PPV may also be used in conjunction with exemplary embodiments of the invention. Examples of such derivatives of PPV include: 1) polymers derived by replacing the phenylene ring with a fused ring system, e.g. replacing the phenylene ring with an anthracene or napthalene ring system. These alternative ring systems may also carry one or more substituents of the type described above with respect to the phenylene ring; 2) polymers derived by replacing the phenylene ring with a heterocyclic ring system such as a furan ring. The furan ring may carry one or more substituents of the type described above in connection with the phenylene ring; 3) polymers derived by increasing the number of vinylene moieties associated with each phenylene or other ring system. The above described derivatives have different energy gaps, which allows flexibility in producing an organic radiation emitting layer 23 which emits in a desired color range or ranges. Additional information on luminescent conjugated polymers is described in U.S. Pat. No. 5,247,190, which is hereby incorporated by reference.

Other examples of suitable conjugated polymers include polyfluorenes such as 2,7-substituted-9-substituted fluorenes and 9-substituted fluorene oligomers and polymers. Polyfluorenes generally have good thermal and chemical stability and high solid-state fluorescence quantum yields. The fluorenes, oligomers and polymers may be substituted at the 9-position with two hydrocarbyl moieties which may optionally contain one or more of sulfur, nitrogen, oxygen, phosphorous or silicon heteroatoms; a $C_{5-20}$ ring structure formed with the 9-carbon on the fluorene ring or a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which may further be substituted with moieties which are capable of crosslinking or chain extension or a trialkylsiloxy moiety. The fluorene polymers and oligomers may be substituted at the 2- and 7'-positions. The monomer units of the fluorene oligomers and polymers are bound to one another at the 2- and 7'-positions. The 2,7'-aryl-9-substituted fluorene oligomers and polymers may be further reacted with one another to form higher molecular weight polymers by causing the optional moieties on the terminal 2,7'-aryl moieties, which are capable of crosslinking or chain extension, to undergo chain extension or crosslinking.

The above described fluorenes and fluorene oligomers or polymers are readily soluble in common organic solvents. They are processable into thin films or coatings by conventional techniques such as spin coating, spray coating, dip coating and roller coating. Upon curing, such films demonstrate resistance to common organic solvents and high heat resistance. Additional information on such polyfluorenes is described in U.S. Pat. No. 5,708,130, which is hereby incorporated by reference.

Other suitable polyfluorenes which can be used in conjunction with exemplary embodiments of the invention include poly(fluorene) copolymers, such as poly(fluorene-co-anthracene)s, which exhibit blue electroluminescence. These copolymers include a polyfluorene subunit such as 2,7-dibromo-9,9-di-n-hexylfluorene (DHF) and another subunit such as 9,10-dibromoanthracene (ANT). High molecular weight copolymers from DHF and ANT can be prepared by the nickel-mediated copolymerization of the corresponding aryl dibromides. The final polymer molecular weight can be controlled by adding the end capping reagent 2-bromofluorene at different stages of the polymerization. The copolymers are thermally stable with decomposition temperatures above 400° C. and are soluble in common organic solvents such as tetrahydrofuran (THF), chloroform, xylene, or chlorobenzene. They emit blue light having a wavelength of about 455 nm. Additional information on such polyfluorenes is described in Gerrit Klarner et al., "Colorfast Blue Light Emitting Random Copolymers Derived from Di-n-hexylfluorene and Anthracene", 10 Adv. Mater. 993–997 (1998), which is hereby incorporated by reference.

According to another preferred embodiment of a single layer device as shown in FIG. 4, the organic radiation emitting layer 23 comprises a molecularly doped polymer. A molecularly doped polymer typically comprises a binary solid solution of charge transporting molecules which are molecularly dispersed in an inert polymeric binder. The charge transporting molecules enhance the ability of holes and electrons to travel through the doped polymer and recombine. The inert polymer offers many alternatives in terms of available dopant materials and mechanical properties of the host polymer binder.

One example of a molecularly doped polymer comprises poly(methyl methacrylate) (PMMA) molecularly doped with the hole transporting molecule N,N'-diphenyl-N,N'-bis (3-methylsphenyl)-1,1'-biphenyl-4,4'-diamine (TPD) and the luminescent material tris(8-quinolinolato)-aluminum (III) (Alq). TDP has a high hole drift mobility of $10^{-3}$ $cm^2$/volt-sec, while Alq is a luminescent metal complex having electron transporting properties in addition to its luminescent properties.

The doping concentration is typically about 50%, while the molar ratio of TDP to Alq may vary from about 0.4 to 1.0, for example. A film of the doped PMMA can be prepared by mixing a dichloroethane solution containing suitable amounts of TPD, Alq, and PMMA, and dip coating the solution onto the desired substrate, e.g. an indium tin oxide (ITO) electrode. The thickness of the doped PMMA layer is typically about 100 nanometers. When activated by application of a voltage, a green emission is generated. Additional information on such doped polymers is described in Junji Kido et al., "Organic Electroluminescent Devices Based on Molecularly Doped Polymers", 61 Appl. Phys. Lett. 761–763 (1992), which is hereby incorporated by reference.

Figure 8:
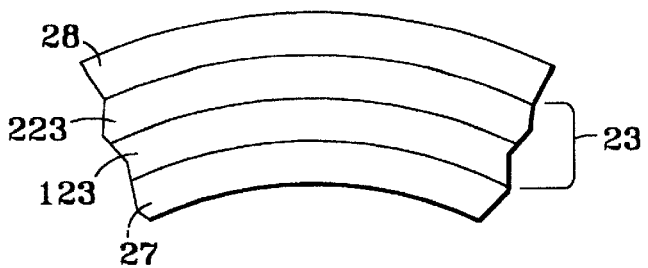
FIGS. 8–11 are partial front cross sectional views of organic radiation emitting layers along line A–A' in FIG. 3, according to the preferred embodiments of the present invention.

According to another preferred embodiment of the invention shown in FIG. 8, the organic radiation emitting layer 23 comprises two sublayers. The first sublayer 123 provides hole transport, electron transport, and luminescent properties and is positioned adjacent the cathode 27. The second sublayer 223 serves as a hole injection sublayer and is positioned adjacent the anode 28. The first sublayer 123 comprises a hole-transporting polymer doped with electron transporting molecules and a luminescent material, e.g. a dye or polymer. The hole-transporting polymer may comprise poly(N-vinylcarbazole) (PVK), for example. The electron transport molecules may comprise 2-(4-biphenyl)-5-(4-tert-butylphenyl)-1,3,4-oxadiazole (PBD), for example. The luminescent material typically comprises small molecules or polymers which act as emitting centers to vary the emission color. For example, the luminescent materials may comprise the organic dyes coumarin 460 (blue), coumarin 6 (green) or nile red. Thin films of these blends can be formed by spin coating a chloroform solution containing different amounts of PVK, electron transport molecules, and luminescent materials. For example, a suitable mixture comprises 100 weight percent PVK, 40 weight percent PBD, and 0.2–1.0 weight percent organic dye.

The second sublayer 223 serves as a hole injection sublayer and may comprise poly(3,4) ethylenedioxythiophene/polystyrenesulphonate (PEDT/PSS), for example, available from Bayer Corporation, which can be applied by conventional methods, such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities", 44 IEEE Trans. on Elec. Devices 1269–1281 (1997), which is hereby incorporated by reference.

Figure 9:
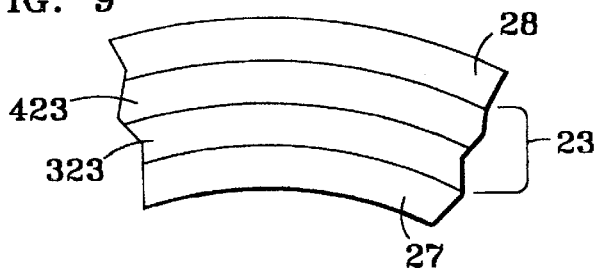

According to another preferred embodiment of the invention shown in FIG. 9, the organic radiation emitting layer 23 includes a first sublayer 323 comprising a luminescent sublayer and a second sublayer 423 comprising a hole transporting sublayer. The hole transporting sublayer 423 may comprise an aromatic amine that is readily and reversibly oxidizable, for example. One example of such a luminescent sublayer and a hole transporting sublayer is described in A. W. Grice et al, "High Brightness and Efficiency of Blue Light-Emitting Polymer Diodes", 73 Appl. Phys. Letters 629–631 (1998), which is hereby incorporated by reference. The device described therein comprises two polymer layers sandwiched between an ITO electrode 28 and a calcium electrode 27. The polymer layer 423 next to the ITO electrode 28 is a hole transport layer and comprises a polymeric triphenyldiamine derivative (poly-TPD). The blue emitting polymer layer 323 which is next to the calcium electrode 27 is poly(9,9-dioctylfluorene).

Figure 10:
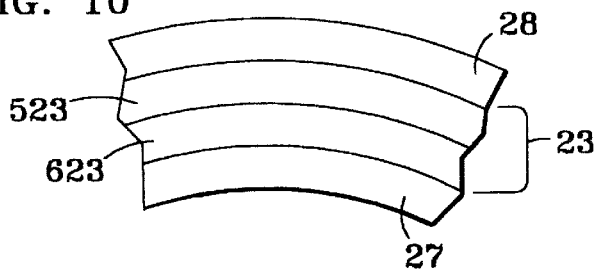

According to another preferred embodiment of the invention shown in FIG. 10, the organic radiation emitting layer 23 comprises a first sublayer 523 which includes luminescent and hole transport properties, and a second sublayer 623 which includes electron injection properties. The first sublayer 523 comprises a polysilane, and the second sublayer 623 comprises an oxadiazole compound. This structure produces ultraviolet (UV) light.

Polysilanes are linear silicon (Si)-backbone polymers substituted with a variety of alkyl and/or aryl side groups. In contrast to π-conjugated polymers, polysilanes are quasi one-dimensional materials with delocalized σ-conjugated electrons along the polymer backbone chain. Due to their one-dimensional direct-gap nature, polysilanes exhibit a sharp photoluminescence with a high quantum efficiency in the ultraviolet region. Examples of suitable polysilanes include poly(di-n-butylsilane) (PDBS), poly(di-n-pentylsilane) (PDPS), poly(di-n-hexylsilane) (PDHS), poly(methyl-phenylsilane) (PMPS), and poly[-bis(p-butylphenyl)silane] (PBPS). The polysilane sublayer 523 can be applied by spin coating from a toluene solution, for example. The electron injection sublayer 623 may comprise 2,5-bis(4-biphenyl)-1,3,4-oxadiazole (BBD), for example. Additional information on UV-emitting polysilane organic radiation emitting layers is described in Hiroyuki Suzuki et al, "Near-ultraviolet Electroluminescence from Polysilanes", 331 Thin Solid Films 64–70 (1998), which is hereby incorporated by reference.

Figure 11:
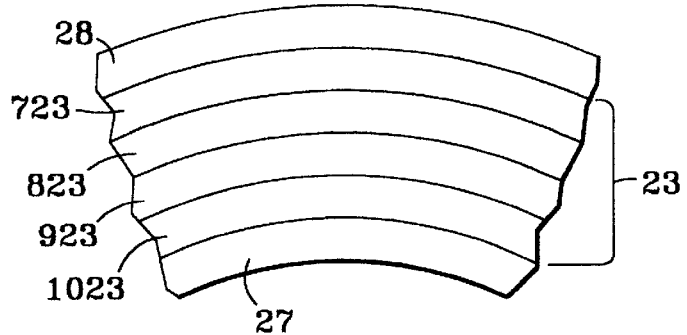

According to another preferred embodiment of the invention shown in FIG. 11, the organic radiation emitting layer 23 comprises a hole injecting sublayer 723, a hole transporting sublayer 823, a luminescent sublayer 923, and an electron injecting sublayer 1023. The hole injecting sublayer 723 and hole transporting sublayer 823 efficiently provide holes to the recombination area. The electrode injecting sublayer 1023 efficiently provides electrons to the recombination area.

The hole injecting sublayer 723 may comprise a porphyrinic compound, such as a metal free phthalocyanine or a metal containing phthalocyanine, for example. The hole transporting sublayer 823 may comprise a hole transporting aromatic tertiary amine, where the latter is a compound containing at least one trivalent nitrogen atom that is bonded only to carbon atoms, at least one of which is a member of an aromatic ring. The luminescent sublayer 923 may comprise, for example, a mixed ligand aluminum chelate emitting in the blue wavelengths, such as bis(R-8-quinolinolato)-(phenolato)aluminum(III) chelate where R is a ring substituent of the 8-quinolinolato ring nucleus chosen to block the attachment of more than two 8-quinolinolato ligands to the aluminum atom. The electron injection sublayer 1023 may comprise a metal oxinoid charge accepting compound such as a tris-chelate of aluminum. Additional information on such four-layer materials and devices are described in U.S. Pat. No. 5,294,870, which is hereby incorporated by reference.

It should be understood that layer 23 is not limited to the above examples, and can comprise any number of sublayers desired. The organic radiation emitting layer(s) 23 can be used to design an organic radiation emitting device 21 which emits in one or more desired colors. For example, the organic radiation emitting device 21 can emit ultraviolet radiation, blue, green, red, white or any other desired colors of light.

The device 21 may emit white light (or any other desired color) by using a phosphor or a luminescent dye, as described above, or by color mixing. To obtain the desired light by color mixing, at least two organic light emitting layers 23 which emit different colors of light are used. For example, the device 21 emits white light if it contains red, green and blue organic light emitting layers, or orange and blue organic light emitting layers 23. The different color emitting organic layers may be overlaid on top of one another in any acceptable order. Thus, a red emitting layer may be formed above a green emitting layer which is formed above a blue emitting layer. Alternatively, small strips of each color emitting organic layer may be formed adjacent to one another. For example, when 0.1 to 1 mm wide strips of red, green and blue light emitting materials are arranged side by side, the observer perceives their combined output as white. The strips of organic light emitting material may be formed by photolithography and etching or by evaporating or solution coating the organic material onto layer 27 through a mask.

Figure 12:
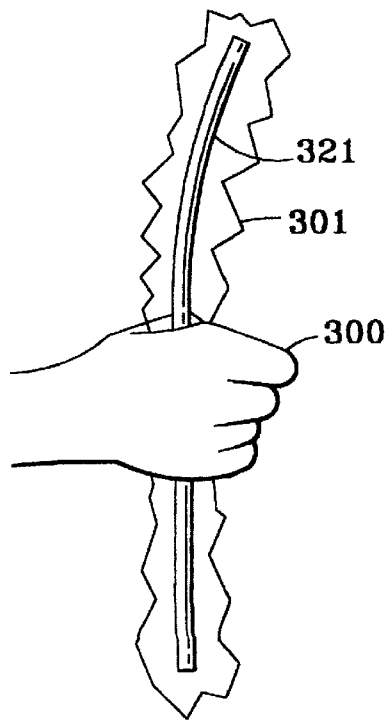
FIGS. 12, 13 and 17 are perspective views of flexible fiber light emitting devices according to the preferred embodiments of the present invention.
Figure 13:
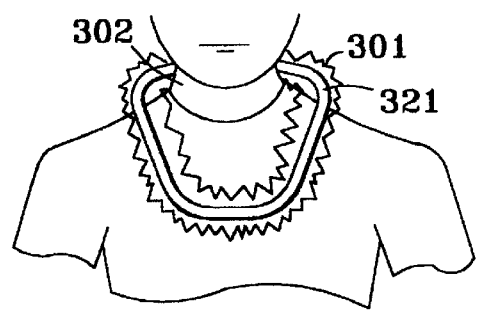

The fiber organic light emitting device 21 may be used for numerous lighting applications, such as novelty, inspection, delineation, safety, large area light sources and fiber optic communications. For example, as illustrated in FIG. 12, the organic radiation emitting device comprises a novelty, hand-held, flexible elongated fiber lighting device 321. The device 321 may comprise the device illustrated in FIGS. 3–7 inserted into a plastic tube and held in a hand 300 to providing local area lighting 301. Alternatively, the device 321 may be wrapped around a body part, such as a neck 302 or arm of the wearer, as illustrated in FIG. 13. Furthermore, the device 321 may be wrapped about inanimate objects, such as hooks or pipes, to provide a "hands free" local area light source. This is advantageous for allowing a person to use both hands while working on the project without using one hand to hold the light source, as one would a flashlight.

Figure 14:
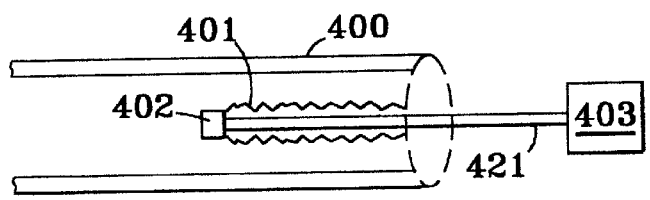
FIGS. 14 and 16 are side cross sectional views of flexible fiber light emitting devices according to the preferred embodiments of the present invention.

FIG. 14 illustrates the use of the device illustrated in FIGS. 3–7 for inspection purpose. In this embodiment, the flexible fiber organic radiation emitting device 421 is inserted into a pipe, duct or crevice 400 to be inspected. The device 421 provide local area lighting 401 inside the area 400 to be examined. If desired, a miniature camera 402 may be attached to the device 421 to provide still or continuous image of the area 400 being inspected. The device 421 may be attached to electronic components 403, such as a computer and monitor, which process, record and/or display the image captured by the camera 402. The flexible fiber device 421 is especially advantageous if the pipe, duct or crevice 400 is curved, because the flexible fiber device 421 can bend around the curve to allow inspection of areas not visible with rigid inspection instruments.

Alternatively, the elongated fiber light emitting device 21 comprises a substantially one dimensional object which is twisted or coiled into any desired a two or three dimensional light emitting object, such as a curtain, sheet or ball. Several examples of two or three dimensional light emitting objects follow.

Figure 15:
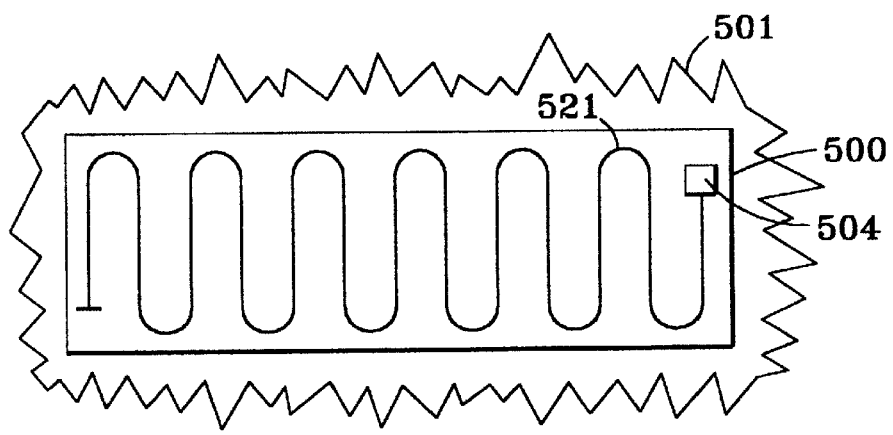
FIG. 15 is a top view of a flexible fiber light emitting device incorporated into a large area panel display according to a preferred embodiment of the present invention.
Figure 16:
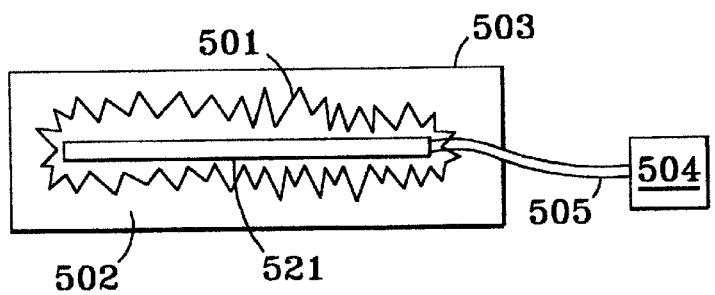

FIG. 15 illustrates the use of the flexible fiber organic radiation emitting device 521 in a large area light source. The flexible fiber device 521 is coiled over a large area flat panel 500 or within a large area glass or plastic tube to provide large area lighting 501. The panel 500 or tube may be rigid or flexible, depending on the desired application. Preferably, the fiber device 521 is sealed in a vacuum or inert atmosphere 502 inside the tube 503 as illustrated in FIG. 16 or between the first panel 500 and a second flat panel (not shown). If the device 521 is sealed in vacuum or an inert atmosphere, then the encapsulating material 29 and/or the moisture barrier layer 26 may be omitted, if desired. The device 521 may be connected to a power source 504 by connecting wires 505. Furthermore, if desired, the phosphor or dye, if present, may be coated onto the light emissive surface of the panel 500 or tube 503 rather than being incorporated into the encapsulating material 29.

Figure 17:
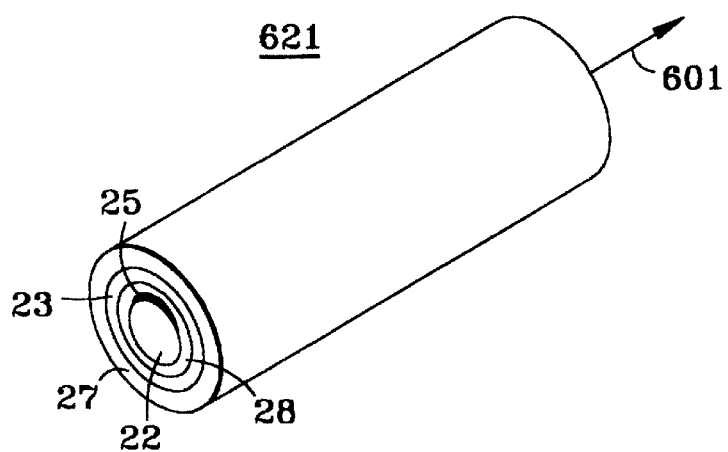

FIG. 17 illustrates the use of the flexible fiber organic radiation emitting device 621 in a directed area light source or for fiber optic communications. In this embodiment, the light transmissive anode layer 28 is located around a light transmissive core member 22, the organic radiation emitting layer 23 surrounds the anode layer 28 and the light impervious cathode layer 27 surrounds the organic radiation emitting layer 23. Since the cathode layer does not transmit light, the radiation (such as visible light) 601 emitted by layer 23 will be channeled through the core member 22 and emitted through the edge of the fiber device 621.

Furthermore, since the cathode layer 27 is made of metal, such as aluminum, silver, gold, calcium, magnesium, indium, tin, lead or their alloys, which is impervious to moisture and air penetration, the moisture barrier layer 26 and/or the encapsulation material 29 may be omitted. Thus, the device 621 is made air and moisture resistant by forming the moisture and air resistant metal layer 27 around the periphery of the device. In contrast, in the prior art device 11 of FIG. 2, a metal oxide layer 18 is formed on a plastic substrate 19. Both of these materials allow some moisture and air to enter the device 11 from the outside. Preferably, the cathode layer 27 comprises a reflective metal, such as gold or silver to enhance the edge emission from the device 621. The metal contact element 25 may be formed in contact with the inner or outer surface of the anode 28, or it may be omitted. Furthermore, the fiber core element 22 may be omitted, and the middle of the device 621 may comprise the light transmissive anode 28.

Such directionally emitted light 601 from a flexible fiber device is advantageous for use in a fiber optic communications or in medical applications, such as in surgical or dental applications. Thus, the flexible fiber light emitting device may be incorporated into a fiber optic communication systems or as part of a medical device, such as a dental drill or a probe containing a camera that is inserted into body cavities. Alternatively, the device 621 may be used with or without a camera to examine pipes, ducts or crevices, as illustrated in FIG. 14.

A method of making the flexible organic radiation emitting device 21 illustrated in FIGS. 3–7 according to one embodiment of the present invention will now be described. First, a fiber core containing an outer cathode layer is formed. If the core contains a fiber core member 22, then the cathode layer 27 is first formed around the fiber core member 22. If the core does not contain a fiber core member 22, then a fiber or wire shaped cathode 27 is provided. Then, the at least one organic radiation emitting layer 23 is deposited around the cathode layer 27. A radiation transmissive anode layer 27 is then deposited the at least one organic radiation emitting layer 23. The power source 24 is then electrically connected to the cathode layer 27 and the anode layer 28.

If desired, a metal contact element 25 is formed in contact with a first portion of an outer surface of the anode layer 28. A second portion of the contact element is electrically connected with the power source 24. Furthermore, the optional moisture barrier layer 26 may be formed around the anode 28 and the contact element 25. The optional encapsulating material 29 may then be formed around the anode 28, and elements 25 and 26, if present. The fiber core may be cut to an appropriate length for each OLED device 21 prior to forming any layers on the core, or the fiber may by cut into the appropriate length after some or all layers are deposited thereon.

The step of forming a cathode layer 27 comprises evaporating, sputtering electroplating or electroless plating a calcium, gold, indium, manganese, tin, lead, aluminum, silver, magnesium, a magnesium/silver alloy, or a combination of an first calcium or lithium fluoride sublayer and a second aluminum or silver sublayer around the fiber core member 22. Furthermore, CVD may be used to deposit some metal layers.

The step of forming at least one organic radiation emitting layer 23 comprises evaporating or solution coating at least one polymer or at least one organic molecule containing layer around the cathode layer 27. For example, the small organic molecules and/or polymer precursors may be thermally evaporated onto the cathode layer 27 followed by polymerization of the precursors through heat treatment. Alternatively, the organic layer 23 may be deposited onto the cathode layer 27 by solution coating, such as dip coating, spray coating or ink jet processing (i.e., dispensing the organic layer 23 through a nozzle onto the cathode layer 27).

The step of forming the anode layer 28 comprises sputtering, evaporating or plating an ITO, tin oxide, nickel, or gold layer around the at least one organic radiation emitting layer 23. Furthermore, the anode oxide layers, such as ITO and indium oxide may be solution coated onto layer 27 by a sol-gel process and CVD may be also used to deposit some metal layers. The step of forming the metal contact element 25 comprises evaporating, sputtering or plating a metal strip in contact with the first portion of the outer surface anode layer 28 or attaching a metal wire around the anode layer 28.

The step of forming the optional barrier layer 26 comprises depositing a $SiO_2$ or a $Si_3N_4$ layer by sputtering, evaporation or chemical vapor deposition (CVD). The step of forming the optional encapsulation material 29 comprises solution coating, such as dip coating or spray coating, silicone or epoxy, which optionally contains a phosphor or a fluorescent dye, onto the anode layer 28 or onto the barrier layer 26, if present. The completed fiber OLED device is then connected to the power source 24 and optionally placed into a tube or a lighting panel, as illustrated in FIGS. 3 and 12–17.

Figure 18:
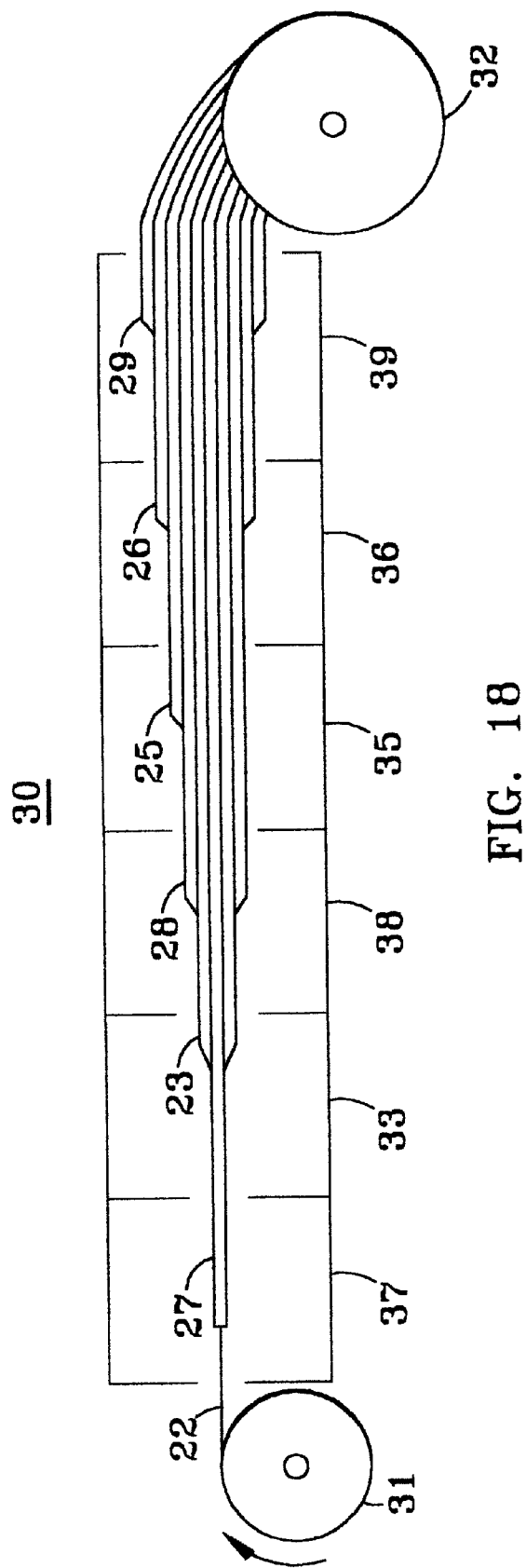
FIG. 18 is a side cross sectional view of an apparatus for manufacturing of the flexible fiber light emitting devices according to a preferred embodiment of the present invention.

A preferred method of making a flexible fiber organic radiation emitting device 21, 121, 221 comprises a continuous "spool to spool" process illustrated in FIG. 18. The method comprises the following steps. First, the flexible fiber core member containing an outer cathode layer is wound from a first spool 31 to a second spool 32 in a coating apparatus 30. As discussed above, if the core contains a fiber core member 22, then the cathode layer 27 is first formed around the fiber core member 22. If the core does not contain a fiber core member 22, then a fiber or wire shaped cathode 27 is provided. The spools 31, 32 may have the same size or different sizes (the apparatus 30 is illustrated schematically in FIG. 18, and is not necessarily to scale). The spools 31, 32 rotate in tandem to transfer the flexible fiber core from the first spool 31 to the second spool 32.

The flexible fiber core moves through different deposition areas of the deposition apparatus 30, where each layer is sequentially deposited. Preferably, each deposition area comprises a discrete deposition chamber of the apparatus 30. If the core contains a fiber core member 22, then a cathode layer 27 is formed around the fiber core member 22 in a first deposition area or chamber 37. The at least one organic radiation emitting layer 23 is deposited around the cathode layer 27 in a second deposition area or chamber 33. The anode layer 28 is then deposited around the at least one organic radiation emitting layer 23 in a third deposition area or chamber 38. The coated core is then unwound from the second spool 32 and separated into a plurality of flexible fiber sections by sawing or other cutting methods. A power source 24 is then electrically connected to the cathode and the anode on a each fiber section to complete the light emitting device.

A metal contact element 25 is formed on an outer surface of the anode layer 28, in a fourth deposition area or chamber 35. The optional barrier layer 26 may be formed in a fifth deposition area or chamber 36 and the optional encapsulating material 29 can be formed around the anode layer 28 or barrier layer 26 in a sixth deposition area or chamber 39.

Preferably, the first through sixth deposition areas or chambers comprise liquid or vapor deposition areas or chambers, sequentially arranged from the first spool to the second spool in the following order: 37, 33, 38, 35, 36, 39. Of course, if any layer is to be omitted, then the corresponding chamber may also be omitted. The deposition areas may be all liquid or all vapor type, or a mix of both.

The liquid deposition of the conductive cathode 27 layer, the anode layer 28 and the metal strip contact element 25 may comprise electroplating or electroless plating in a plating bath. Alternatively, some low temperature metals may be spray coated onto the fiber. Furthermore, metal oxide anode layers, such as ITO and indium oxide, may be deposited by the sol-gel process (i.e., depositing an organic metal oxide layer and then evaporating the organic components). The organic layer 23 may be deposited onto the cathode layer 27 by solution coating, such as dip coating, spray coating or ink jet processing. The barrier layer 26 may be deposited by the sol-gel process and the encapsulating material 29 may be deposited by dip coating or spray coating.

The vapor deposition of the electrode and moisture barrier layers 25, 26, 27 and 28 may comprise sputtering, evaporation or CVD. Vapor deposition of the organic layer 23 may comprise evaporation. If the layers are deposited by vapor coating, then a plurality of the surfaces of the fiber are exposed to the material to be deposited. For example, if layers 27 and/or 28 are to be deposited by chemical vapor deposition, then the metal containing gas sources are positioned in chambers 37 and 38 to evenly coat all sides of the fiber.

Figure 19:
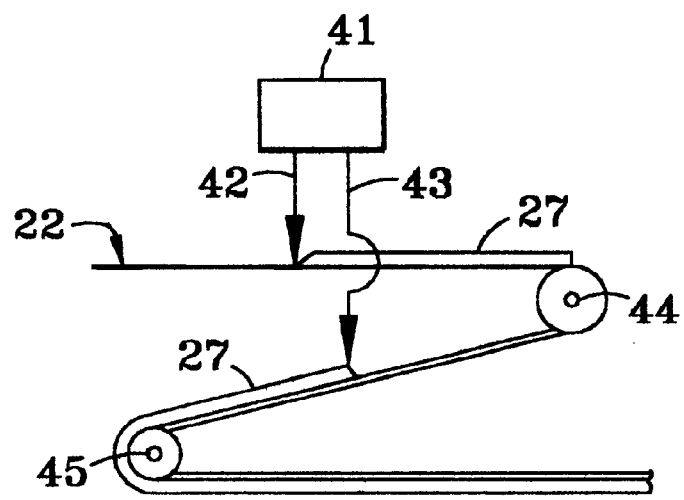
FIGS. 19, 20 and 22 are side cross sectional views of deposition chambers of the apparatus of FIG. 18, according to preferred embodiments of the present invention.

If the layers, such as layers 27 and 28, are to be deposited by sputtering or evaporation, then the flexible fiber may be wound around pulleys, such as pulleys 44 and 45 illustrated in FIG. 19 to expose at least two sides (or all sides of a circular fiber) of the fiber to the source 41 (i.e., an evaporation source or a sputtering target) of the conductive material 42, 43 to be deposited. In FIG. 19, the first pulley 44 lies in a different plane in the page than the second pulley 45. Thus, the first side of the fiber is exposed to material 42 emitted from a first portion of the source 41 before the fiber reaches the pulley 44. An electrode layer 27 is deposited on the first side of the fiber 22. Then, the second side of the fiber is exposed to material 43 emitted from a second portion of the source 41, when the fiber is passing between the pulleys 44 and 45. Thus, the electrode layer 27 is deposited on the second side of the fiber 22.

Figure 20:
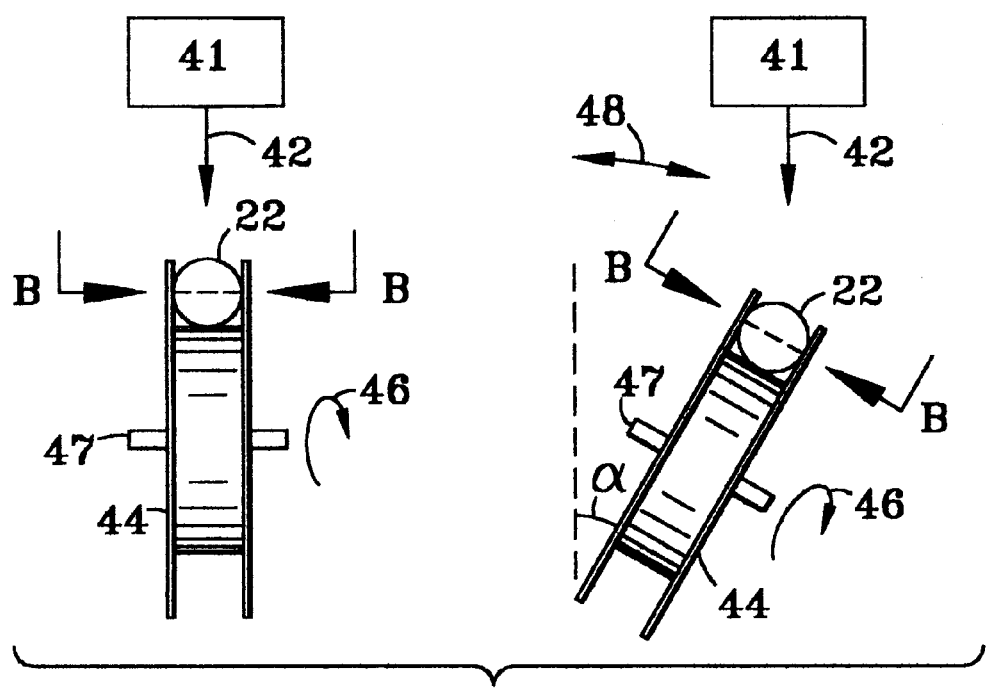

Alternatively a plurality of the surfaces of the fiber are exposed to the material to be deposited as shown in FIG. 20.

The pulley 44 rotates in direction 46 about its axis 47 to advance the fiber 22 from the first spool 31 to the second spool 32. The axis 47 of the pulley 44 also continuously wiggles in direction 48 by an angle α. Thus, the top portion or side of the fiber 22 above the arbitrary line B—B is exposed to the material 42 from source 41 when the pulley 44 is vertical, and another portion or side of the fiber 22 is exposed to the material 42 from source 41 when the pulley 44 is inclined by an angle α with respect to the vertical direction.

Figure 21:
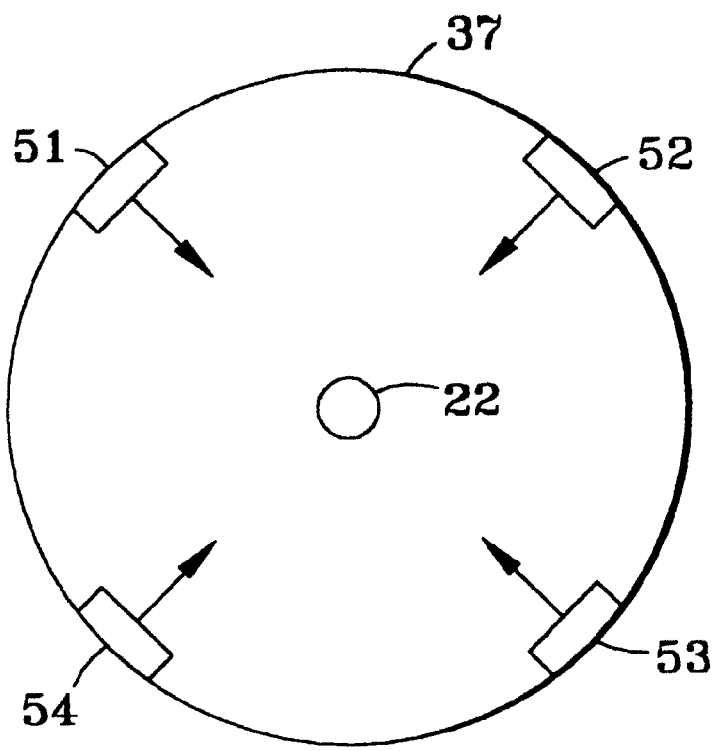
FIG. 21 is a front cross sectional view of a deposition chamber of the apparatus of FIG. 18, according to a preferred embodiment of the present invention.

FIG. 21 illustrates another alternative embodiment of exposing a plurality of surfaces of the fiber to the material to be deposited. In FIG. 21, the sources of the material to be deposited, such as evaporation sources or sputtering targets 51, 52, 53, 54 are arranged around the circumference of the deposition chamber 37, such that they face a plurality of the surfaces of the fiber 22. The evaporation sources 51–54 may comprise Knudsen evaporation cells, while the sputtering sources 51–54 may comprise electron beam sputtering targets. While four sources 51–54 are illustrated, there may be two, three or more than four sources, depending on the desired process parameters. Furthermore, while FIGS. 19–21 illustrate the formation of the cathode layer 27 in chamber 37, the method illustrated in FIGS. 19–21 is equally applicable to the formation of the anode layer 28 in chamber 38, to the formation of the organic layer 23 by evaporation in chamber 33, and barrier layer 26 by sputtering in chamber 36.

Figure 22:
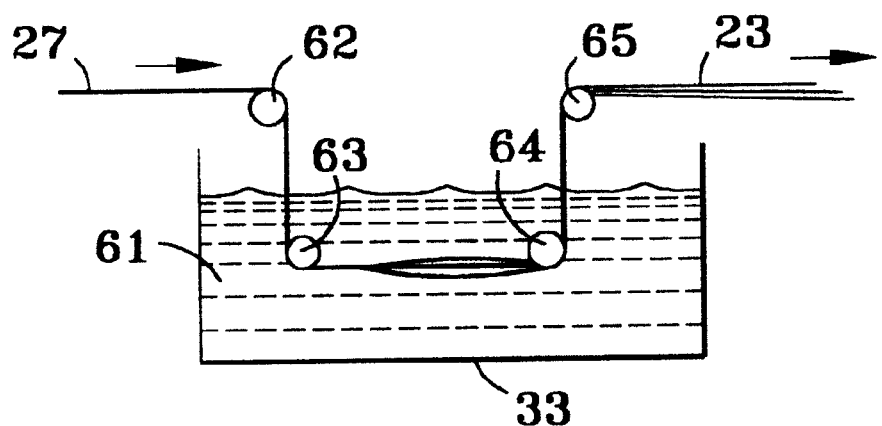

FIG. 22 illustrates the formation of the organic layer 23 by dip coating in the deposition chamber 33. The deposition chamber 33 contains a bath filled with an organic polymeric or molecular liquid 61. The fiber containing the cathode layer 27 is passed through the bath 61 using intermediate spools 62–65, such that all sides of the fiber are coated with the organic layer 23. Alternatively, spray coating or ink jet processing may be used to deposit layer 23 on the fiber using nozzles. The nozzles 51, 52, 53, 54 may be arranged as illustrated in FIG. 19. Furthermore, while FIG. 22 illustrates the formation of the organic layer 23 in chamber 33, the method illustrated in FIG. 22 equally applicable to the formation of the cathode 27 or anode layers 28 by plating in chambers 37 and 38, and to the formation of the encapsulating material 29 in chamber 39.

Other embodiments of the invention will be apparent to those skilled in the art from a consideration of the embodiments disclosed herein. It is intended that the specification and examples be considered as exemplary only, with the scope and spirit of the invention being defined by the following claims.

What is claimed is:

1. A fiber organic radiation emitting device comprising:
   a fiber core having an outer first electrode;
   at least one organic radiation emitting layer positioned over an outer surface of the first electrode; and
   a radiation transmissive second electrode positioned over the organic radiation emitting layer;
   wherein the at least one organic radiation emitting layer comprises an organic material that emits the radiation when a voltage is applied across the first and second electrodes.

2. The organic radiation emitting device of claim 1, wherein the fiber core comprises:
   (a) a fiber core member having a first non-planar surface and the first electrode having a non-planar outer surface over the first surface; or
   (b) an elongated fiber first electrode containing a non-planar outer surface.

3. The organic radiation emitting device of claim 2, wherein the fiber core comprises a flexible fiber core member having a non-planar outer surface and the first electrode surrounding the entire outer surface of the core member.

4. The organic radiation emitting device of claim 2, wherein:
the light emitting device comprises a flexible, elongated fiber having a cross section comprising a circle, an oval, a polygon or a combination thereof.

5. The organic radiation emitting device of claim 4, wherein:
an inner surface of the second electrode surrounds and contacts an outer surface of the at least one organic radiation emitting layer; and
an inner surface of the at least one organic radiation emitting layer surrounds and contacts the outer surface of the first electrode.

6. The organic radiation emitting device of claim 5, wherein:
the first electrode comprises a radiation transmissive anode; and
the second electrode comprises a cathode.

7. The organic radiation emitting device of claim 5, further comprising a metal contact element in contact with a first portion of an outer surface of the second electrode.

8. The organic radiation emitting device of claim 7, wherein:
the first electrode comprises a cathode;
the second electrode comprises an anode; and
the metal contact element comprises a metal strip in contact with a first portion of the outer surface of the anode or a metal wire surrounding an entire perimeter of the outer surface of the anode.

9. The organic radiation emitting device of claim 8, further comprising:
a radiation transmissive encapsulating material, having an inner surface surrounding an outer surface of the anode; and
a radiation transmissive moisture barrier layer.

10. The organic radiation emitting device of claim 9, wherein:
the core member comprises a flexible metal wire, a flexible glass fiber or a flexible plastic fiber;
the cathode comprises calcium, gold, indium, manganese, tin, lead, aluminum, silver, magnesium, a magnesium/silver alloy, or a combination of a first calcium or lithium fluoride sublayer and a second aluminum or silver sublayer;
the at least one organic radiation emitting layer comprises at least one polymer or at least one organic molecule containing layer;
the anode comprises an ITO, tin oxide, nickel, or gold layer;
the barrier layer comprises a $SiO_2$ or a $Si_3N_4$ layer;
the encapsulation material comprises silicone or epoxy.

11. The organic radiation emitting device of claim 10, further comprising a phosphor or a fluorescent dye in the encapsulation material which emits visible light in response to being irradiated by visible or ultraviolet radiation emitted by the organic radiation emitting layer.

12. The organic radiation emitting device of claim 7, further comprising a power source electrically connected to the cathode and the metal contact element.

13. The organic radiation emitting device of claim 12, wherein the device comprises a hand-held, flexible elongated fiber lighting device.

14. The organic radiation emitting device of claim 12, wherein the elongated fiber comprises a substantially one dimensional object which is twisted or coiled into a two or three dimensional light emitting object.

15. The organic radiation emitting device of claim 12, wherein:
(a) the elongated fiber is coiled within a tube or over a flat panel; and sealed in a vacuum or inert atmosphere; or
(b) the elongated fiber further comprises a miniature camera for inspection of pipes, ducts and crevices.

16. The organic radiation emitting device of claim 6, further comprising a power source electrically connected to the cathode and the anode, and wherein the elongated fiber comprises a directional, edge light emitting lighting device.

17. The organic radiation emitting device of claim 1, wherein the device does not contain a planar, light transmissive device substrate.

18. A flexible, fiber organic radiation emitting device, comprising:
a flexible elongated core member having an outer surface;
a cathode having an inner surface surrounding the outer surface of the core member;
at least one non-planar organic radiation emitting layer, having an inner surface surrounding and contacting an outer surface of the cathode;
a radiation transmissive anode having an inner surface surrounding and contacting an outer surface of the at least one organic radiation emitting layer;
a metal contact element having a first surface in contact with a first portion of an outer surface of the anode; and
a power source electrically connected to the cathode and the metal contact element.

19. The device of claim 18, further comprising:
a radiation transmissive moisture barrier layer having an inner surface surrounding the outer surface of the anode; and
a light transmissive encapsulating material, having an inner surface surrounding an outer surface of the barrier layer.

20. The device of claim 19, wherein:
the core member comprises a flexible metal wire, a flexible glass fiber or a flexible plastic fiber;
the cathode comprises calcium, gold, indium, manganese, tin, lead, aluminum, silver, magnesium, a magnesium/silver alloy, or a combination of a first calcium or lithium fluoride sublayer and a second aluminum or silver sublayer;
the at least one organic radiation emitting layer comprises at least one polymer or at least one organic molecule containing layer;
the anode comprises an ITO, tin oxide, nickel, or gold layer;
the metal contact element comprises a metal strip in contact with the first portion of the outer surface anode or a metal wire surrounding an entire perimeter of the outer surface of the anode;
the barrier layer comprises a $SiO_2$ or a $Si_3N_4$ layer;
the encapsulation material comprises silicone or epoxy containing a phosphor or a fluorescent dye which emits visible light in response to being irradiated by visible or ultraviolet radiation emitted by the organic radiation emitting layer.

21. The device of claim 19, wherein the device comprises a hand-held, flexible elongated fiber lighting device.

22. The device of claim 19, wherein:
the device is coiled within a tube or over a flat panel; and
sealed in a vacuum or inert atmosphere.

23. The device of claim 18, wherein the device does not contain a planar, light transmissive device substrate.

24. A fiber organic radiation emitting device comprising:
a fiber core having an outer first electrode;
at least one organic radiation emitting layer positioned over an outer surface of the first electrode, the at least one organic radiation emitting layer substantially covering the fiber core; and
a radiation transmissive second electrode positioned over the organic radiation emitting layer;
wherein the at least one organic radiation emitting layer comprises an organic material that emits the radiation when a voltage is applied across the first and second electrodes.

* * * * *